United States Patent
Fackenthal et al.

(10) Patent No.: US 10,388,351 B2
(45) Date of Patent: Aug. 20, 2019

(54) WEAR LEVELING FOR RANDOM ACCESS AND FERROELECTRIC MEMORY

(71) Applicant: Micron Technology, Inc., Boise, ID (US)

(72) Inventors: Richard E. Fackenthal, Carmichael, CA (US); Daniele Vimercati, El Dorado Hills, CA (US); Duane R. Mills, Shingle Springs, CA (US)

(73) Assignee: Micron Technology, Inc., Boise, ID (US)

( * ) Notice: Subject to any disclaimer, the term of this patent is extended or adjusted under 35 U.S.C. 154(b) by 97 days.

(21) Appl. No.: 15/691,454

(22) Filed: Aug. 30, 2017

(65) Prior Publication Data

US 2019/0066752 A1    Feb. 28, 2019

(51) Int. Cl.
*G11C 29/00* (2006.01)
*G11C 11/22* (2006.01)
*G06F 11/10* (2006.01)

(52) U.S. Cl.
CPC ...... *G11C 11/2253* (2013.01); *G06F 11/1008* (2013.01); *G11C 11/2275* (2013.01)

(58) Field of Classification Search
CPC ... G11C 11/2253; G11C 11/2275; G11C 7/20; G11C 29/802; G11C 2029/3202; G11C 7/1006; G11C 7/22; G11C 2029/0411; G06F 11/1008; G06F 11/1048
See application file for complete search history.

(56) References Cited

U.S. PATENT DOCUMENTS

| 9,721,639 B1 | 8/2017 | Calderoni et al. |
| 2013/0024605 A1 | 1/2013 | Sharon et al. |
| 2015/0155046 A1 | 6/2015 | Lee et al. |
| 2017/0097869 A1 | 4/2017 | Sharon et al. |

FOREIGN PATENT DOCUMENTS

WO    2009009303 A2    1/2009

OTHER PUBLICATIONS

ISA/KR, International Search Report and Written Opinion of the International Searching Authority, Int'l. Appl. No. PCT/US2018/047790, Nov. 28, 2018, Korean Intellectual Property Office, Seo-gu, Daejeon, Republic of Korea, 13 pgs.

*Primary Examiner* — Guerrier Merant
(74) *Attorney, Agent, or Firm* — Holland & Hart LLP

(57) ABSTRACT

Methods, systems, and devices related to wear leveling for random access and ferroelectric memory are described. Non-volatile memory devices, e.g., ferroelectric random access memory (FeRAM) may utilize wear leveling to extend life time of the memory devices by avoiding reliability issues due to a limited cycling capability. A wear-leveling pool, or number of cells used for a wear-leveling application, may be expanded by softening or avoiding restrictions on a source page and a destination page within a same section of memory array. In addition, error correction code may be applied when moving data from the source page to the destination page to avoid duplicating errors present in the source page.

25 Claims, 9 Drawing Sheets

WEAR LEVELING FOR RANDOM ACCESS AND FERROELECTRIC MEMORY

BACKGROUND

The following relates generally to memory array and more specifically to wear leveling for random access and ferroelectric memory.

Memory devices are widely used to store information in various electronic devices such as computers, wireless communication devices, cameras, digital displays, and the like. Information is stored by programming different states of a memory cell. For example, binary memory cells have two states, often denoted by a logic "1" or a logic "0." In other systems, more than two states may be stored. To access the stored information, a component of the electronic device may read, or sense, the stored state in the memory cell. To store information, a component of the electronic device may write, or program, the state in the memory cell.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), three-dimensional (3D) cross-point (3D Xpoint) memory, 3D Not-AND (NAND) memory, and others. Memory devices may be volatile or non-volatile. Non-volatile memory devices, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics. In some cases, however, limitations on memory cell reliability due to a limited program and erase cycling endurance capability may adversely impact performance and lifetime of the memory devices that customers experience.

BRIEF DESCRIPTION OF THE DRAWINGS

The disclosure herein refers to and includes the following figures.

DETAILED DESCRIPTION

Figure 1:
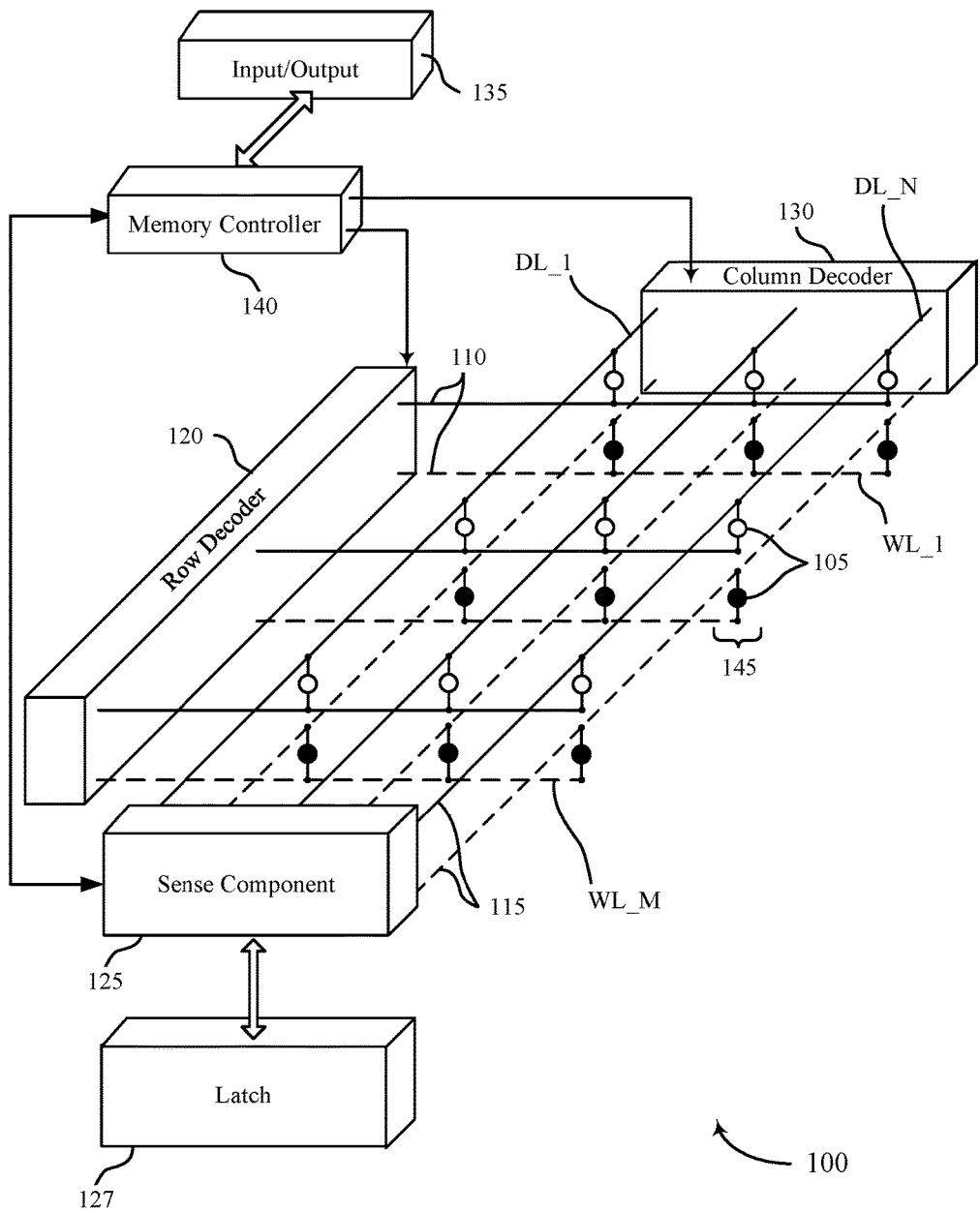
FIG. 1 illustrates an example of a diagram of memory device having an array of memory cells that supports wear leveling for random access and ferroelectric memory in accordance with embodiments of the present disclosure.

Wear leveling may extend the usable life of non-volatile memory devices, e.g., FeRAM, that may exhibit a limited cycling capability. Wear leveling may distribute a number of program and erase cycles over a set of different memory cells (i.e., wear-leveling pool) to avoid causing a certain subset of memory cells corresponding to a logical address experiencing increased numbers of program and erase cycles when compared to the rest of the memory cells.

In wear-leveling application, the larger the wear-leveling pool, the more effective wear leveling may be. The wear-leveling pool may refer to a number of pages of an array that data circulates among. A page may refer to a number of data handled as a unit at various interfaces and may be related to a group of data associated with a word line common to a section of a memory array. For example, a typical size of a page in FeRAM may be 64 bytes. Other sizes of a page may be feasible, e.g., 128, 256, 512 bytes, etc. By way of example, if a wear-leveling pool is 1,000 pages, and if a customer hits one logical page continuously, those customer cycles may be spread over the 1,000 pages within the wear-leveling pool and thus the physical cycle counts each page experiences may be reduced by a factor of 1,000. If on the other hand, the wear-leveling pool is 32,000 pages, then the physical cycle counts each page experiences may be reduced by a factor of 32,000. Hence, there may be a motivation to facilitate wear leveling over a larger size of wear-leveling pool to mitigate risks associated with the limited cycling capability that non-volatile memory devices may exhibit.

In wear-leveling application, a page copy operation may be performed in which contents of one page (i.e., source page) is copied from a section of a memory array and moved to another page (i.e., destination page). During the page copy operation a set of sense components and latches that are common to the source and the destination pages may be used, which may necessitate that the source and the destination pages are restricted to be present in the same section configured with the common set of sense components and latches. Such restriction may limit a size of wear-leveling pool thereby inhibiting advantages of having a larger size of wear-leveling pool.

Another consideration in wear-leveling applications may relate to one or more error bits that may be present in contents of a source page. When contents of the source page including error bits is copied to a destination page, contents of the destination page may include the duplicated error bits, which in turn, may result in reduced error correction capacity allocated to the destination page. This issue may be referred to as an error propagation problem. A certain number of error bits associated with a page may be corrected by scrubbing contents of the page through error correction code (ECC) logic. ECC logic may be present on a chip with a memory array. In some cases, ECC logic may be configured to perform ECC function to data sets from any section within a bank-level logic of the memory array. Hence, the contents of the source page may be brought beyond the set of sense components and latches associated with the section of the memory array for the ECC logic to correct the error bit(s) that may be present in the contents of the source page to avoid the error propagation problem.

Techniques are described herein that support wear leveling for random access and ferroelectric memory, which may provide advantage of expanding a size of wear-leveling pool while consuming less power and reducing certain delay times, e.g., row refresh time ($t_{RFC}$). In addition, error correction may be accomplished while moving contents of a page from a source page to a destination page during wear-leveling applications. As used herein, the techniques are described using ferroelectric memory cells with three access lines, namely plate line, digit line, and word line in conjunction with other support circuitry components (e.g., sense components, latches, ECC logic, internal logic circuit, etc.). Some of the support circuitry components may be placed under multi-decks of array of ferroelectric memory cells, namely as a part of complementary metal oxide semiconductor (CMOS) under the array, in some examples.

Features of the disclosure introduced above are further described below in the context of memory device. Specific examples are then described for memory array and memory portions that relate to wear leveling for random access and ferroelectric memory. These and other features of the disclosure are further illustrated by and described with reference to apparatus diagrams, system diagrams, and flowcharts that relate to wear leveling for random access and ferroelectric memory.

FIG. 1 illustrates an example of a diagram of memory device 100 having an array of memory cells that supports wear leveling for random access and ferroelectric memory in accordance with embodiments of the present disclosure. FIG. 1 is an illustrative schematic representation of various components and features of memory device 100, and thus may not show other components. As such, it should be appreciated that the components and feature of memory device 100 are shown to illustrate functional interrelationships supporting wear leveling for random access and ferroelectric memory, not their actual physical positions within memory device 100. Memory device 100 may also be referred to as an electronic memory apparatus. Memory device 100 includes an array of memory cells 105 that are programmable to store different states. The array of memory cells 105 may be referred to as memory array, memory core, and the like. In some cases, memory cell 105 may be a ferroelectric memory cell that may include a capacitor with a ferroelectric material as the insulating material. In some cases, the capacitor may be referred to as a ferroelectric container. Each memory cell 105 may be programmable to store two states, denoted as a logic 0 and a logic 1. Each memory cell 105 may be stacked on top of each other resulting in two-decks of memory cell 145. Hence, the example in FIG. 1 may be an example that depicts two decks of memory array for illustrative purposes only. In some examples, single deck of memory array may support wear leveling for random access and ferroelectric memory in accordance with embodiments of the present disclosure.

In some cases, memory cells 105 are configured to store more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with paraelectric or linear polarization properties as the insulator. By contrast, a ferroelectric memory cell may include a capacitor with a ferroelectric material as the insulating material. Different levels of charges of a ferroelectric capacitor may represent different logic states. Ferroelectric materials have non-linear polarization properties; some details and advantages of a ferroelectric memory cell 105 are discussed below.

Operations such as reading and writing, which may be referred to as access operations, may be performed on memory cells 105 by activating or selecting word line 110 and digit line 115. Word lines 110 may also be known as row lines, sense lines, or access lines. Digit lines 115 may also be known as bit lines, column lines, or access lines. References to word lines and digit lines, or their analogues, are interchangeable without loss of understanding or logical operation. Word lines 110 and digit lines 115 may be perpendicular (or nearly perpendicular) to one another to create an array of memory cells. Depending on the type of memory cell (e.g., FeRAM, RRAM, etc.), other access lines may be present (not shown), such as plate lines, for example. It should be appreciated that the exact operation of the memory device may be altered based on the type of memory cell and/or the specific access lines used in the memory device.

Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell, e.g., a capacitor, may be electrically isolated from the digit line by a selector device. The word line 110 may be connected to and may control the selector device. For example, the selector device may be a transistor (e.g., thin-film transistor (TFT) or metal-oxide-semiconductor (MOS) transistor) and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105. In addition, as described below in FIG. 2, access operation of ferroelectric memory cells may need an additional connection to a node of the ferroelectric memory cell, namely cell plate (CP) node via plate line.

Accessing memory cells 105 may be controlled through a row decoder 120 and a column decoder 130. For example, a row decoder 120 may receive a row address from a memory controller 140 and activate the appropriate word line 110 based on the received row address. Similarly, a column decoder 130 receives a column address from the memory controller 140 and activates the appropriate digit line 115. For example, memory device 100 may include multiple word lines 110, labeled WL_1 through WL_M, and multiple digit lines 115, labeled DL_1 through DL N, where M and N depend on the array size. Thus, by activating a word line 110 and a digit line 115, e.g., WL_2 and DL_3, the memory cell 105 at their intersection may be accessed. In addition, access operation of ferroelectric memory cells may need to activate a corresponding plate line for the memory cell 105, associated with plate line decoder (not shown).

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. In some cases, latch 127 may store the logic state of memory cell 105 that sense component detects during wear-leveling operations in accordance with embodiments of the present disclosure. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120.

A memory cell 105 may be set, or written, by similarly activating the relevant word line 110 and digit line 115—i.e., a logic value may be stored in the memory cell 105. Column decoder 130 or row decoder 120 may accept data, for example input/output 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. In some cases, the writing the logic state back to the memory cells 105 may be referred to as pre-charging. Additionally, activating a single word line 110 may result in the discharge of all memory cells in the row; thus, several or all memory cells 105 in the row may need to be re-written or pre-charged.

In some memory architectures, including DRAM, memory cells may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

The memory controller 140 may control the operation (e.g., read, write, re-write, refresh, discharge, pre-charge, etc.) of memory cells 105 through the various components, for example, row decoder 120, column decoder 130, sense component 125, and latch 127. The memory controller 140 may also control operations associated with wear leveling and ECC function in conjunction with ECC logic during wear-leveling operations in accordance with embodiments of the present disclosure. The memory controller 140 may be an internal logic circuit present on the same substrate with the memory array. In some cases, one or more of the row decoder 120, column decoder 130, sense component 125, and latch 127 may be co-located with the memory controller 140. Memory controller 140 may generate row and column address signals in order to activate the desired word line 110 and digit line 115. Memory controller 140 may also generate and control various voltages or currents used during the operation of memory device 100. For example, it may apply discharge voltages to a word line 110 or digit line 115 after accessing one or more memory cells 105.

In general, the amplitude, shape, or duration of an applied voltage or current discussed herein may be adjusted or varied and may be different for the various operations discussed in operating memory device 100. Furthermore, one, multiple, or all memory cells 105 within memory device 100 may be accessed simultaneously; for example, multiple or all cells of memory device 100 may be accessed simultaneously during an access (or write or program) operation in which all memory cells 105, or a group of memory cells 105, are set or reset to a single logic state. It should be appreciated that the exact operation of the memory device may be altered based on the type of memory cell and/or the specific access lines used in the memory device. In some examples where other access lines e.g., plate lines, may be present (not shown), a corresponding plate line in collaboration with a word line and a digit line may need to be activated to access a certain memory cell 105 of the memory array. It should be appreciated that the exact operation of the memory device may vary based on the type of memory cell and/or the specific access lines used in the memory device.

Figure 2:
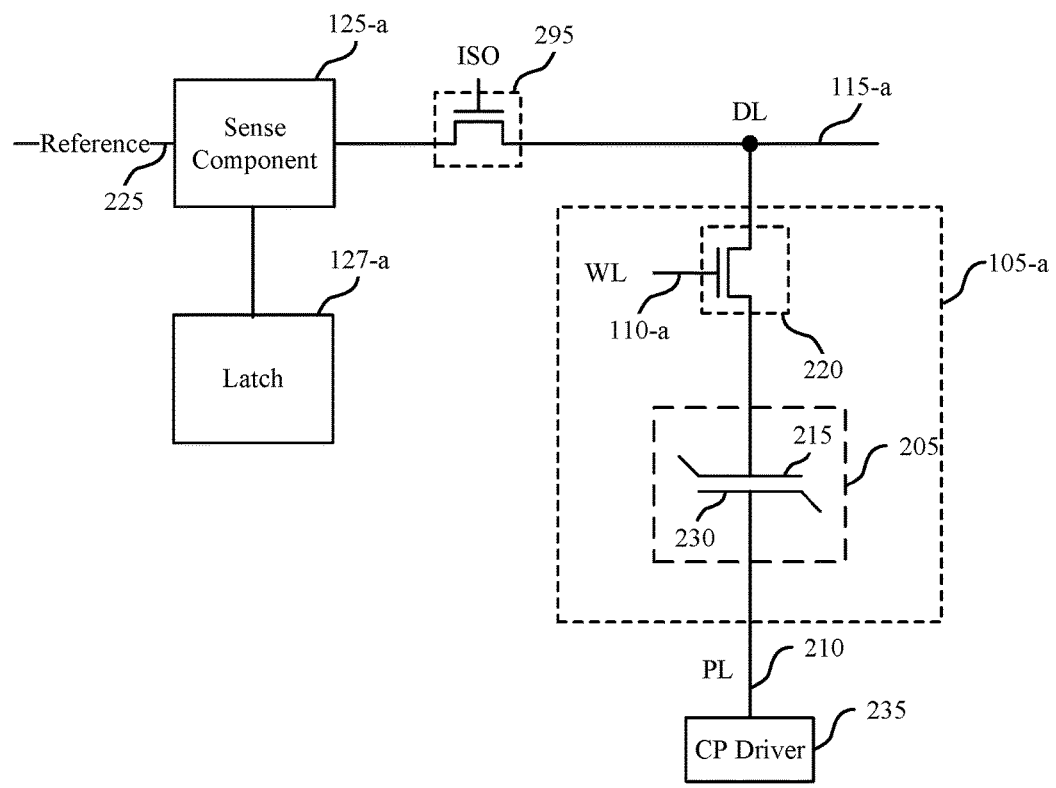
FIG. 2 illustrates an example of a ferroelectric memory cell and circuit components that supports wear leveling for random access and ferroelectric memory in accordance with embodiments of the present disclosure.

FIG. 2 illustrates an example of a ferroelectric memory cell and circuit components that supports wear leveling for random access and ferroelectric memory in accordance with embodiments of the present disclosure. Circuit 200 includes a memory cell 105-*a*, word line 110-*a*, digit line 115-*a*, sense component 125-*a*, ISO device 295, and latch 127-*a*, which may be examples of a memory cell 105, word line 110, digit line 115, sense component 125, and latch 127, respectively, as described with reference to FIG. 1. Memory cell 105-*a* may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-*a*. Circuit 200 also includes selector device 220 and reference line 225. Cell plate 230 may be accessed via plate line 210 (PL) and cell bottom 215 may be accessed via digit line 115-a (DL). As described above, various states may be stored by charging or discharging capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selector device 220 is deactivated, and capacitor 205 can be connected to digit line 115-a when selector device 220 is activated. Activating selector device 220 may be referred to as selecting memory cell 105-a. In some cases, selector device 220 is a transistor (e.g., thin-film transistor (TFT) or metal-oxide-semiconductor (MOS) transistor) and its operation is controlled by applying a voltage to the transistor gate, where the voltage magnitude is greater than the threshold voltage magnitude of the transistor. Word line 110-a (WL) may activate selector device 220; for example, a voltage applied to word line 110-a is applied to the transistor gate, connecting capacitor 205 with digit line 115-a.

In other examples, the positions of selector device 220 and capacitor 205 may be switched, such that selector device 220 is connected between plate line 210 and cell plate 230 and such that capacitor 205 is between digit line 115-a and the other terminal of selector device 220. In this embodiment, selector device 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select memory cell 105-a and a voltage may be applied to plate line 210. In some cases, digit line 115-a is virtually grounded and then isolated from the virtual ground, which may be referred to as "floating," prior to biasing plate line 210 and word line 110-a. Biasing plate line 210 may result in a voltage difference (e.g., plate line 210 voltage minus digit line 115-a voltage) across capacitor 205. The voltage difference may yield a change in the stored charge on capacitor 205, where the magnitude of the change in stored charge may depend on the initial state of capacitor 205— e.g., whether the initial state stored a logic 1 or a logic 0. This may cause a change in the voltage of digit line 115-a based on the charge stored on capacitor 205. Operation of memory cell 105-a by varying the voltage to cell plate 230 may be referred to as "moving cell plate."

The change in voltage of digit line 115-a may depend on its intrinsic capacitance. That is, as charge flows through digit line 115-a, some finite charge may be stored in digit line 115-a and the resulting voltage may depend on the intrinsic capacitance. The intrinsic capacitance may depend on physical characteristics, including the dimensions, of digit line 115-a. Digit line 115-a may connect many memory cells 105 so digit line 115-a may have a length that results in a non-negligible capacitance (e.g., on the order of picofarads (pF)). The resulting voltage of digit line 115-a may then be compared to a reference (e.g., a voltage of reference line 225) by sense component 125-a in order to determine the stored logic state in memory cell 105-a. Other sensing processes may be used.

Sense component 125-a may include various transistors or amplifiers to detect and amplify a difference in signals, which may be referred to as latching. Sense component 125-a may include a sense amplifier that receives and compares the voltage of digit line 115-a and reference line 225, which may be a reference voltage. The sense amplifier output may be driven to the higher (e.g., a positive) or lower (e.g., negative or ground) supply voltage based on the comparison. For instance, if digit line 115-a has a higher voltage than reference line 225, then the sense amplifier output may be driven to a positive supply voltage. In some cases, the sense amplifier may additionally drive digit line 115-a to the supply voltage. Sense component 125-a may then latch the output of the sense amplifier and/or the voltage of digit line 115-a, which may be used to determine the stored state in memory cell 105-a, e.g., logic 1. Alternatively, if digit line 115-a has a lower voltage than reference line 225, the sense amplifier output may be driven to a negative or ground voltage. Sense component 125-a may similarly latch the sense amplifier output to determine the stored state in memory cell 105-a, e.g., logic 0. The latched logic state of memory cell 105-a may then be output, for example, through column decoder 130 as output 135 with reference to FIG. 1. In some cases, latch 127-a may include various transistors and other circuit elements to store the logic state of memory cell 105 that sense component 125-a detects.

ISO device 295, during wear-leveling operation for random access and ferroelectric memory in accordance with embodiments of the present disclosure, may isolate the digit line nodes of sense component 125 from digit line 115-a (DL) of memory cell 105-a. When the sense component 125 is isolated from the memory cell 105-a, the memory cells may be programmed or pre-written to a logic state while other operations are on-going. Hence, when memory cells associated with a page are isolated, entire memory cells of the page may be pre-written to a single logic state during wear-leveling application. Memory cells may be pre-written a single logic state to reduce (or "hide," at least in part) the time delay involved when writing a cell or group of cells. The time delay reduction may be achieved due to an inherent asymmetric nature of cell programming or a reduced net amount of data to be programmed, or combination of both. For example, programming a logic state of 0 may be faster than programming a logic state of 1 in ferroelectric memory cells. In addition, a memory cell may need to be programmed only when the data (e.g., a logic state of 0) to be stored in the memory cell is different than the pre-written data (e.g., a logic state of 1). ISO device 295 enables at least two or more steps to operate in parallel during wear-leveling operation as described below.

To write memory cell 105-a, a voltage may be applied across capacitor 205. Various methods may be used. In one example, selector device 220 may be activated through word line 110-a in order to electrically connect capacitor 205 to digit line 115-a. A voltage may be applied across capacitor 205 by controlling the voltage of cell plate 230 by CP driver 235 (through plate line 210) and cell bottom 215 (through digit line 115-a). To write a logic 0, cell plate 230 may be taken high, that is, a positive voltage may be applied to plate line 210 by CP driver 235 (through plate line 210), and cell bottom 215 may be taken low, e.g., virtually grounding or applying a negative voltage to digit line 115-a. The opposite process is performed to write a logic 1, where cell plate 230 is taken low and cell bottom 215 is taken high.

Figure 3:
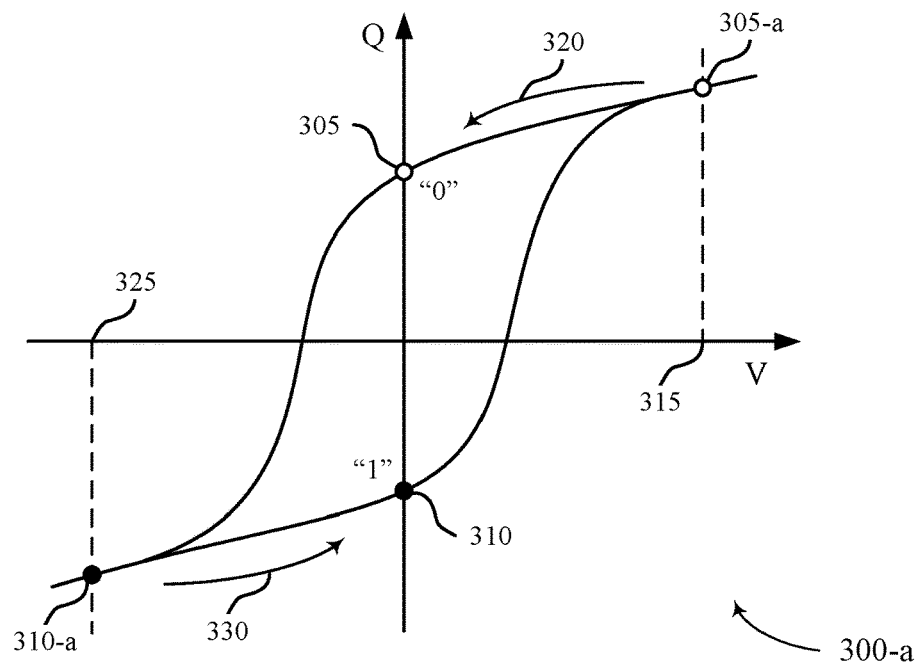
FIG. 3 illustrates an example of non-linear electrical properties with hysteresis curves for a ferroelectric memory cell that supports wear leveling for random access and ferroelectric memory in accordance with embodiments of the present disclosure.
Figure 3:
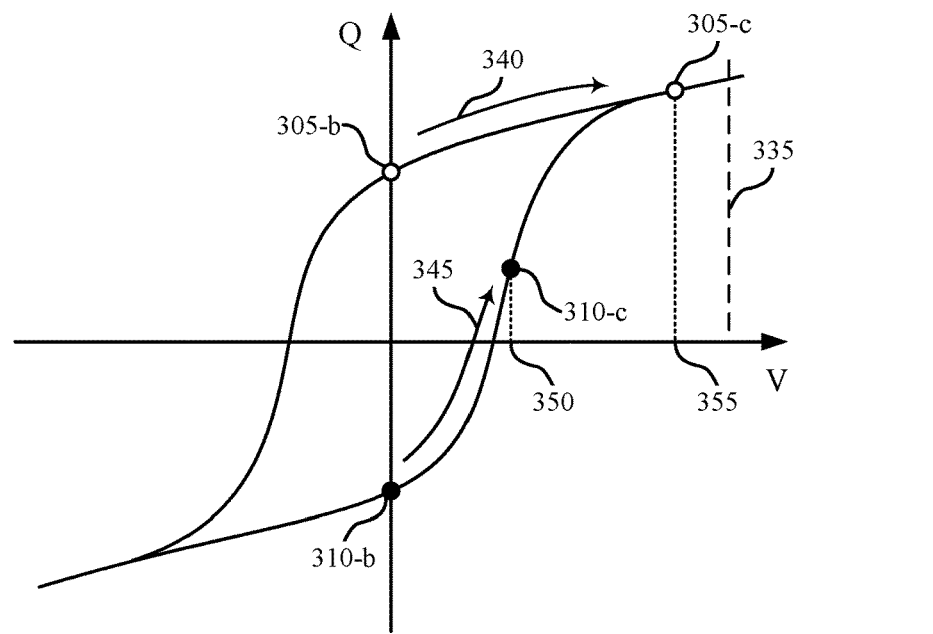

FIG. 3 illustrates an example of non-linear electrical properties with hysteresis curves 300-a and 300-b for a ferroelectric memory cell that supports wear leveling for random access and ferroelectric memory in accordance with embodiments of the present disclosure. Hysteresis curves 300-*a* and 300-*b* illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V, across the ferroelectric capacitor.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-*a* is reached. Upon removing voltage 315, charge state 305-*a* follows path 320 until it reaches charge state 305 at zero voltage. Similarly, charge state 310 is written by applying a net negative voltage 325, which results in charge state 310-*a*. After removing negative voltage 325, charge state 310-*a* follows path 330 until it reaches charge state 310 at zero voltage. Charge states 305-*a* and 310-*a* may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-*b* or 310-*b* was initially stored. For example, hysteresis curve 300-*b* illustrates two possible stored charge states 305-*b* and 310-*b*. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not be equal to voltage 335 and instead may depend on the voltage of the digit line. The position of final charge states 305-*c* and 310-*c* on hysteresis curve 300-*b* may thus depend on the capacitance of the digit line and may be determined through a load-line analysis—i.e., charge states 305-*c* and 310-*c* may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335-voltage 350) or (voltage 335-voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335-voltage 350) and (voltage 335-voltage 355). Upon comparison by the sense component, the sensed digit line voltage may be determined to be higher or lower than the reference voltage, and the stored logic value of the ferroelectric memory cell (i.e., a logic 0 or 1) may be determined.

As discussed above, reading a memory cell that does not use a ferroelectric capacitor may degrade or destroy the stored logic state. A ferroelectric memory cell, however, may maintain the initial logic state after a read operation. For example, if charge state 305-*b* is stored, the charge state may follow path 340 to charge state 305-*c* during a read operation and, after removing voltage 335, the charge state may return to initial charge state 305-*b* by following path 340 in the opposite direction. During wear-leveling operation in accordance with embodiments of the present disclosure, FeRAM memory cells may be pre-written a single logic state to reduce (or "hide" to a host or application) the time delay involved when writing a cell or group of cells. In some examples, FeRAM memory cells in a destination page may be pre-written with a logic state 1. Subsequently, a FeRAM memory cell in the destination page may need to be programmed only when the data (e.g., a logic state of 0) to be stored in the FeRAM memory cell is different than the pre-written data (e.g., a logic state of 1) to accomplish a fast execution of wear-leveling operation with reduced energy consumption.

Figure 4:
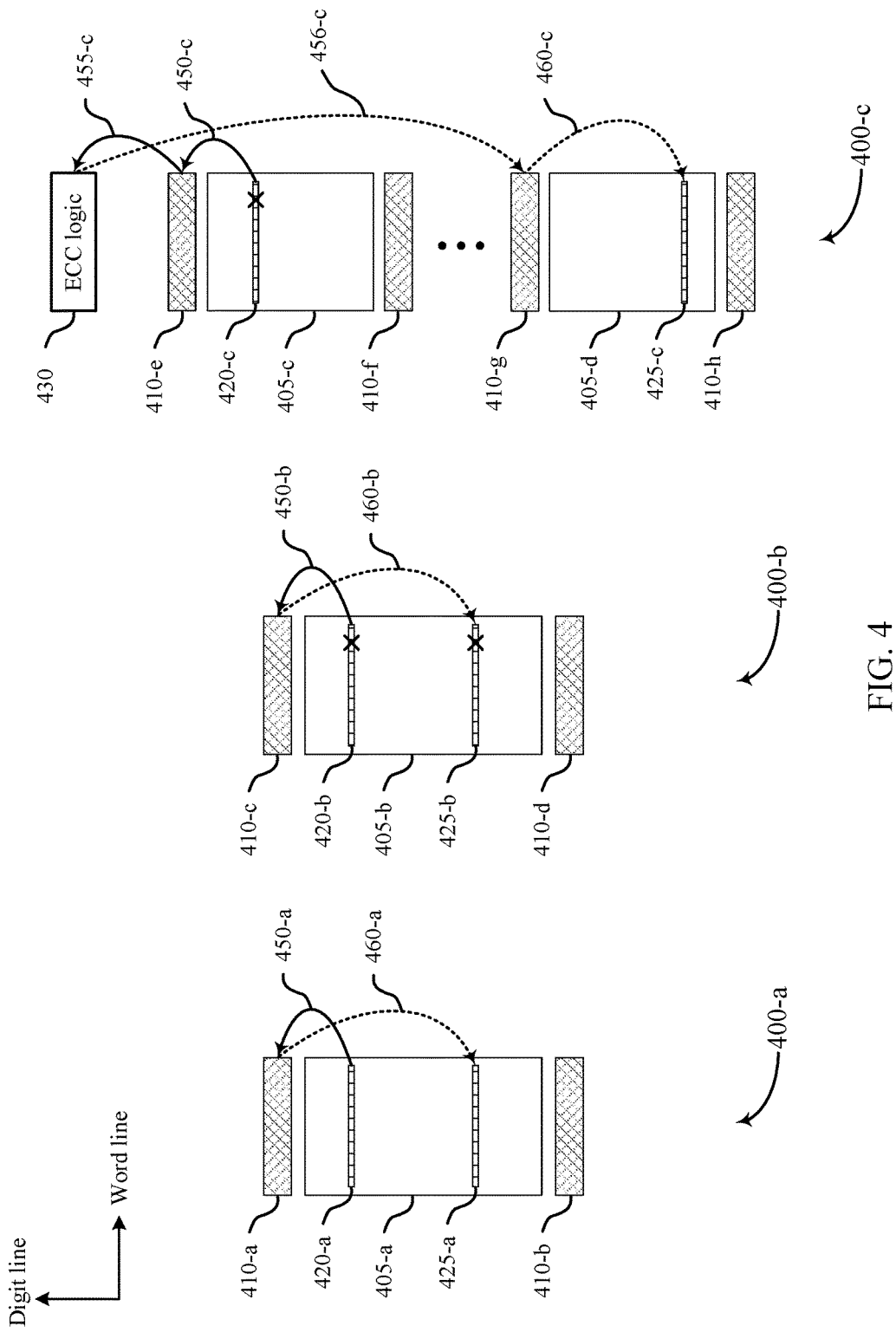
FIG. 4 illustrates diagrams of operations that support wear leveling for random access and ferroelectric memory in accordance with embodiments of the present disclosure.

FIG. 4 illustrates diagrams of operations that support wear leveling for random access and ferroelectric memory in accordance with embodiments of the present disclosure. Diagrams 400 includes memory tile 405, sense part 410, source page 420, destination page 425, and error correction code (ECC) logic 430. Source page 420 and destination page 425 may or may not be present in a same memory tile.

Memory tile 405 may be configured to include various numbers of memory cells. In some cases, a memory tile 405 may include 1024×1024 memory cells arranged in two-dimensional matrix. Other configurations of a memory tile, e.g., 2048×2048 or 1024×2048 memory cells, may be feasible. In some cases, a horizontal arrangement of memory tile 405 may be referred to as a section of a memory array (not shown). In some cases, the horizontal direction may be in word line direction. In some cases, a vertical arrangement of the sections (i.e., a two-dimensional arrangement of tiles) may be referred to as a bank of memory array (not shown). In some cases, the vertical direction may be in digit line direction.

Sense part 410 may include a sense component and a latch. The sense component in the sense part 410 may be an example of sense component 125 as described with reference to FIGS. 1 and 2. The latch in the sense part 410 may be an example of latch 127 as describe with reference to FIGS. 1 and 2. In some cases, a sense part 410 may be associated with a section of a memory array. As an example, sense part 410-*e* may be configured to sense a section associated with memory tile 405-*c* and may not be configured to sense other sections of the memory array (e.g., memory tile 405-*d*). Sense part 410 may be located on one side or both sides of memory tile 405 in vertical or digit line direction.

ECC logic 430 may be located on a chip with a memory array. ECC logic 430 may include various transistors and other circuit elements that are configured to detect and correct a certain number of errors that may be present in a data set. ECC logic 430 may be configured to perform ECC function on data sets from any section of a bank-level logic of the memory array (e.g., memory tile 405-*c* or memory tile 405-*d*). In some cases, ECC logic 430 may be configured to perform ECC function on a subset of data from a page of data. The subset of data on which ECC logic 430 performs ECC function may be referred to as a code-word.

As shown in diagram 400-*a* and 400-*b*, both source page 420 and destination page 425 may be located within a same tile (e.g., memory tile 405-*a* or 405-*b*), hence the same section (not shown) of the memory array. Source page 420 may include memory cells (i.e., memory cells from which data is copied during wear-leveling operation) associated with a word line common to the memory cells. In some cases, source page 420 may include a row of 1024 memory cells connected to a word line as described with reference to FIGS. 1 and 2. Each of the 1024 memory cells may be associated with a digit line that may be connected to sense part 410 as described with reference to FIGS. 1 and 2. Destination page 425 may include the same number of memory cells (i.e., memory cells to which data is copied during wear-leveling operation) with source page (e.g., a row of 1024 memory cells) associated with another word line commonly configured for the memory cells. Memory cells in source page 420 and memory cells in destination page 425 may be associated with common bit lines as described with reference to FIGS. 1 and 2.

Diagram 400-*a* may illustrate an example of page copy operation performed during wear-leveling operation. Source page 420-*a* may be activated (i.e., the word line and the digit lines associated with source page 420-*a* are selected or turned on) to capture data stored in source page 420-*a* at sense part 410-*a* and/or 410-*b*. Decoding, sensing and capturing of data may be performed according to procedures as described above with reference to FIGS. 1 through 3. Capturing of data from source page 420-*a* to sense part 410-*a* may be illustrated with path 450-*a*. Capturing of data from source page 420-*a* to sense part 410-*b* is omitted for simplicity of illustration.

Based on capturing of the data from source page 420-*a* in sense part 410-*a* and/or 410-*b*, for example, the word line and the digit lines associated with source page 420-*a* may be deselected, or turned off. Based on turning off the word line and the digit lines associated with source page 420-*a*, a word line and digit lines associated with destination page 425-*a* may be selected or turned on. Based on turning on the word line and digit lines associated with destination page 425-*a*, i.e., having destination page 425-*a* enabled, the data stored or captured in sense part 410-*a* and/or 410-*b* may be written to memory cells in destination page 425-*a*. In some cases, writing data from sense part 410-*a* and/or 410-*b* to destination page 425-*a* may be referred to as pre-charging destination page 425-*a*. Writing of data from sense part 410-*a* to destination page 425-*a*, i.e., pre-charging destination page 425-*a*, may be illustrated with path 460-*a*. Writing of data from sense part 410-*b* to destination page 425-*a* is omitted for simplicity of illustration.

The sequence described above may move data from source page 420-*a* to destination page 425-*a* during wear-leveling operation. Sense part 410-*a* and/or 410-*b* may facilitate the sequence of moving the data. The sequence avoids a particular physical page (e.g., the source page 420-*a*) from being repeatedly cycled (e.g., programming and erasure of memory cells in source page 420-*a*) by utilizing another physical page (e.g., memory cells in destination page 425-*a*) so as to effectively spread the cycling events over a number of pages in a wear-leveling pool (e.g., 1024 different physical page locations). A logical address of the data may remain the same regardless of a physical location of the page where the data actually reside within the wear-leveling pool. Due to absence of pre-charging of source page 420-*a* after capturing the data therefrom, the data present in source page 420-*a* may be no longer valid or reliable. In the wear-leveling application, the source page 420-*a* may become a new spare page, i.e., a memory page available to serve as a destination page.

As illustrated in diagram 400-*a*, utilizing sense part 410-*a* and/or 410-*b* may enable wear-leveling operation within a section but the wear-leveling pool may be restricted among the pages present in the section (e.g., 1024 pages) because the sense part 410 is configured to be dedicated for the memory cells of the section.

Diagram 400-*b* may illustrate the movement of data involved in the sequence described above during wear-leveling operation when error(s) may be present in source page 420-*b*. Error(s) may be associated with contents of defective or erroneous memory cell(s) in a page. Error(s) is depicted as a symbol X in diagram 400-*b*. Wear-leveling operation involves the same sequence as described above with reference to diagram 400-*a*. Capturing of data including error(s) from source page 420-*b* to sense part 410-*c* may be illustrated with path 450-*b*. Writing of data including error(s) from sense part 410-*c* to destination page 425-*b*, i.e., pre-charging destination page 425-*b*, may be illustrated with path 460-*b*. In the example of diagram 400-*b*, the error(s) may be copied as a part of data from source page 420-*b* to destination page 425-*b*. Such propagation of error may consume error correction capability associated with destination page 425-*b* because destination page 425-*b* may have its own error(s) due to defective or erroneous memory cell(s). Error correction operation may have corrected the contents of defective or erroneous memory cell(s) in source page 420-*b* prior to storing the contents of source page 420-*b* to destination page 425-*b*.

Diagram 400-*c* may illustrate the movement of data involved in another sequence during wear-leveling operation in conjunction with ECC logic 430 to correct error(s) that may be present in source page 420-*c*, as indicated by symbol X. After the data including error(s) from source page 420-*c* is sensed and captured in sense part 410-*e*, as indicated by path 450-*c*, a subset of the data from source page 420-*c* may be sent from sense part 410-*e* to ECC logic 430 and "scrubbed" by ECC logic 430, one at a time. In some cases, the subset may be a code-word (e.g., a part of a page). Scrubbing may mean processing each code-word through ECC logic 430 and correcting errors that may be present in the code-word, as indicated by path 455-*c*. By way of example, if there were eight (8) code-words per page, each code-word may be brought out from sense part 410-*e*, processed through ECC logic 430. Hence, this portion of sequence performing ECC function via ECC logic 430 may be performed in a loop of eight sequences or operations.

Scrubbing the data captured in sense part 410-*e* may involve processing each code-word through ECC logic 430. This may limit the benefits associated with keeping a source page 420 and a destination page 425 within the same section (e.g., a tile 405) as illustrated in diagrams 400-*a* and 400-*b* because of data traffic operations beyond a section level to reach ECC logic 430 that may be present in a bank-level logic of a memory array. However, a size of wear-leveling pool may be increased when a page copy operation may be achieved across different sections because the larger the wear-leveling pool, the more effective wear leveling may be. Thus, while scrubbing may be performed by processing each code-word through ECC logic 430, each code-word scrubbed by ECC logic 430 may be saved at sense part 410-*g* associated with tile 405-*d* as indicated by path 456-*c*.

Tile 405-*d* may be a different tile including destination page 425-*c* and associated with sense part 410-*g* or 410-*h*. Subsequently, the data in sense part 410-*g*, which has been scrubbed by ECC logic 430, may be saved in destination page 425-*c* in tile 405-*d*, as indicated by path 460-*c*. As a result, the contents of source page 420-*c*, with its errors corrected via ECC logic 430, may be transferred to destination page 425-*c* that may be present in a different section of memory array. Due to the error correction function performed by ECC logic 430, the contents of data being stored in destination page 425-*c* may be free from the errors, as indicated by absence of symbol X in destination page 425-*c*. More details of wear-leveling operations as described with reference to diagram 400-*c* in accordance with embodiments of the present disclosure are explained in FIGS. 5A and 5B below.

Figure 5A:
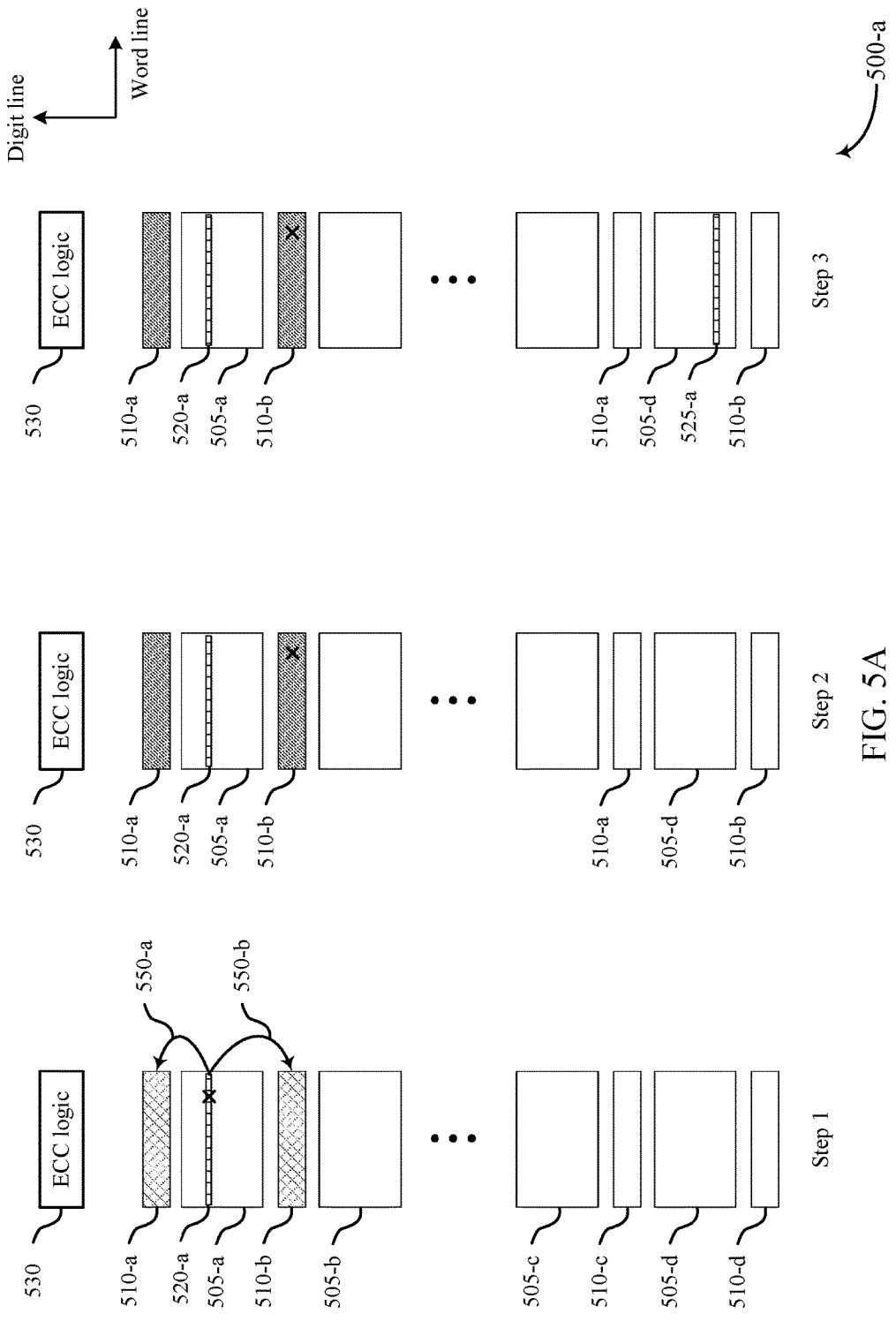
FIGS. 5A and 5B illustrate operations that support wear leveling for random access and ferroelectric memory in accordance with embodiments of the present disclosure.
Figure 5B:
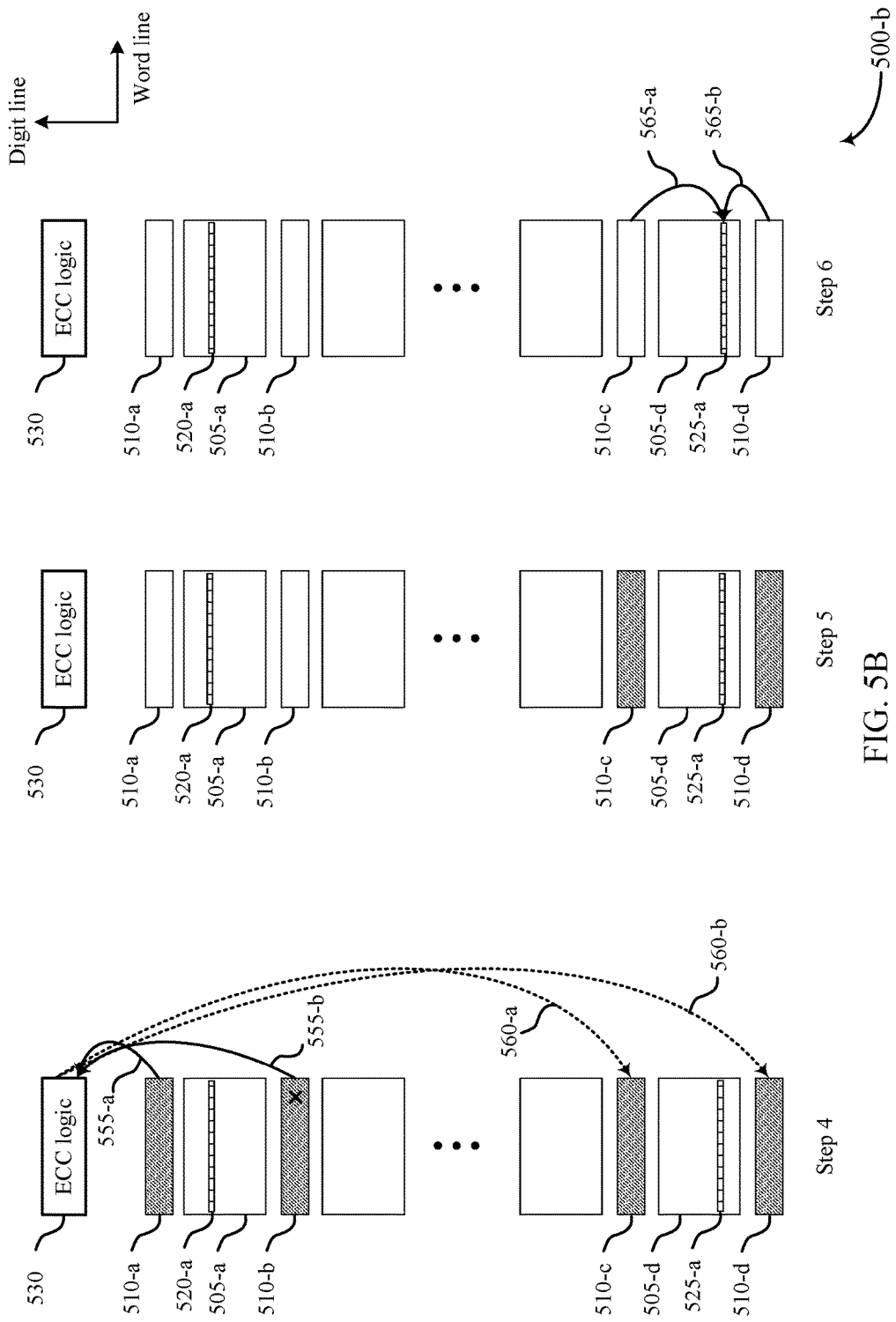

FIGS. 5A and 5B illustrate operations that support wear leveling for random access and ferroelectric memory in accordance with embodiments of the present disclosure. Diagram 500 includes memory tiles 505, sense parts 510, source page 520, destination page 525, and ECC logic 530.

Memory tiles 505 may be an example of memory tiles 405 as described with reference to FIG. 4. As described above, in some cases, a horizontal arrangement of memory tiles 505 may be referred to as a section of a memory array (not shown). In some cases, the horizontal direction may be in word line direction. In some cases, a vertical arrangement of the sections (i.e., a two-dimensional arrangement of tiles) may be referred to as a bank of the memory array. In some cases, the vertical direction may be in digit line direction. Multiple memory tiles 505 are shown in FIGS. 5A and 5B to illustrate moving data from a section of the memory array to another section because the sequence described with reference to FIGS. 5A and 5B may not be restricted to source and destination pages within a same section of the memory array.

Sense part 510 may be an example of sense part 410 as described with reference to FIG. 4. In some cases, sense part 510-*a* and/or 510-*b* may be associated with a tile 505-*a* (or section that includes the tile 505-*a*, not shown) of the memory array such that the sense part 510-*a* and/or 510-*b* may not be utilized to sense other tiles of a different section of the memory array, such as 505-*b*, 505-*c*, or 505-*d*. Sense parts 510 may be located on one side or both sides of memory tiles 505 in vertical or digit line direction, as described above with reference to FIG. 4.

ECC logic 530 may be an example of ECC logic 430 as described with reference to FIG. 4. ECC logic 530 may be configured to perform ECC function for data sets from any sections within a bank-level of the memory array. Hence, ECC logic 530 may perform ECC function for data set from tiles 505-*a*, 505-*b*, 505-*c*, or 505-*d*.

Step 1 of diagram 500-*a* may represent an activate (ACT) step. During the ACT step, source page 520-*a* may be activated (i.e., the word line and the digit lines associated with source page 520-*a* are selected or turned on) to sense and capture data stored in source page 520-*a* to sense part 510-*a* and/or 510-*b*. Symbol X in source page 520-*a* may represent error(s) present in the contents of data in source page 520-*a*. Capturing of data from source page 520-*a* to sense part 510-*a* and/or 510-*b* may be illustrated with path 550-*a* and/or 550-*b*.

Step 2 of diagram 500-*a* may represent a HOLD step. During the HOLD step, the sense components of the sense part 510-*a* and 510-*b* may be shut down. In addition, selection circuitry for word lines and digit lines and other control circuits associated with the memory array may be deactivated except that the data from source page 520-*a* may be still held in the latches of sense part 510-*a* and 510-*b*. Hence, the HOLD step may be viewed as an idle state except the latches of sense part 510-*a* and 510-*b* may retain the data therein. Symbol X in the sense part 510-*b* may represent error(s) present in the contents of data propagated from source page 520-*a*. In addition, the data in source page 520-*a* may no longer be valid or reliable due to absence of pre-charging the data therein. As described above, source page 520-*a* may become a new spare page, i.e., a memory page available to serve as a destination page during wear-leveling application.

Step 3 of diagram 500-*a* may represent a Pre-Set step. During the Pre-Set step, some or all memory cells in destination page 525-*a* in tile 505-*d*, a tile located in a different section, may be programmed to a certain logic state. In some cases, the logic state may correspond to logic 1. It should be appreciated that the destination page 525-*a* may be present in a tile (or a section) different than the tile (or the section) where source page 520-*a* is located, thereby expanding a wear-leveling pool size. During the Pre-Set step, ISO devices associated with the destination page 525-*a* may be deactivated. As explained above with reference to FIG. 2, ISO device, when deactivated, may isolate digit line nodes of sense components from digit lines of the memory array. Memory cells of destination page 525-*a* may be pre-written to a single logic state while ISO devices associated with destination page 525-*a* are deactivated. In some cases, the pre-written logic state may correspond to a logic state of 1.

Step 4 of diagram 500-*b* in FIG. 4B may represent operation of processing through all code-words of source page 520-*a* stored in the latches of sense part 510-*a* and/or 510-*b* via ECC logic 530 to scrub the contents of source page 520-*a*. Scrubbing of code-words by sending them from sense part 510-*a* and/or 510-*b* to ECC logic 530 may be illustrated as paths 555-*a* and/or 555-*b*. Each code-word then may be stored in the latches in sense part 510-*c* and/or 510-*d* associated with destination page 525-*a*. Storing of the code-words from ECC logic 530 to the latch in sense part 510-*c* and/or 510-*d* may be illustrated as paths 560-*a* and/or 560-*b*. Absence of symbol X in the contents of data stored in sense part 510-*c* and/or 510-*d* associated with destination page 525-*a* indicates that the data may be free from the error(s) in the contents of source page 520-*a* due to ECC logic 530 performing ECC function.

It should be appreciated that the operations in step 4 may be performed concurrently with the operations in step 3. ISO devices associated with tile 505-*d*, when deactivated, separate sense part 510-*c* and/or 510-*d* from memory cells in tile 505-*d*, hence memory cells of destination page 525-*a*. The operations in step 3 and step 4 may be performed in parallel because the operations in step 3 (e.g., the Pre-Set step for the memory cells in destination page 525-*a*) may be independent of the operations in step 4 (e.g., processing code-words through ECC logic and store the scrubbed code-words in the latches in sense part 510-*c* and/or 510-*d*) due to the deactivated ISO devices. Concurrent operation of steps 3 and 4 in parallel may reduce (or "hide," at least in part) the overall time associated with wear-leveling operation.

Step 5 of diagram 500-*b* may represent operations associated closing of the latches in sense part 510-*a* and/or 510-*b* without pre-charging source page 520-*a*. At the completion of step 5, i.e., closing the latches of sense part 510-*a* and/or 510-*b*, sense part 510-*a* and/or 510-*b* no longer represents valid data from source page 520-*a*. Also, pre-charging source page 520-*a* may not be necessary because the source page 520-*a* may serve as a spare page during wear-leveling operation. Omission of pre-charging source page 520-*a* may reduce overall time and energy associated with wear-leveling applications.

Step 6 of diagram 500-*b* may represent writing destination page 525-*a* with the data stored in sense part 510-*c* and/or 510-*d*. In some cases, writing destination page 525-*a* may be referred to as pre-charging destination page 525-*a*. Pre-charging the data from sense part 510-*c* and/or 510-*d* to destination page 525-*a* may be illustrated with path 565-*a* and/or 565-*b*. It should be appreciated that pre-charging the data to destination page 525-*a* may include writing a subset of the data only to the memory cells in destination page 525-*a* storing a different logic state than the pre-written logic state established in step 3 as described above. For instance, only the memory cells in destination page 525-*a* to store a logic "0" may need to be programmed with the logic "0" when the memory cells are pre-written to a logic state "1." Reducing the number of memory cells during pre-charging destination page 525-*a* may reduce overall time and energy associated with wear-leveling applications.

The steps 1 through 6 described above with reference to FIGS. 5A and 5B enable wear leveling with a larger wear-leveling pool size by avoiding restrictions on both source and destination pages to be within a same section of memory array. In addition, error correction may be performed to scrub contents of the source page to avoid consuming error correction capacity of the destination page due to error propagation problem. In addition, overall time and energy consumption may be reduced to realize an efficient wear-leveling operation.

Figure 6:
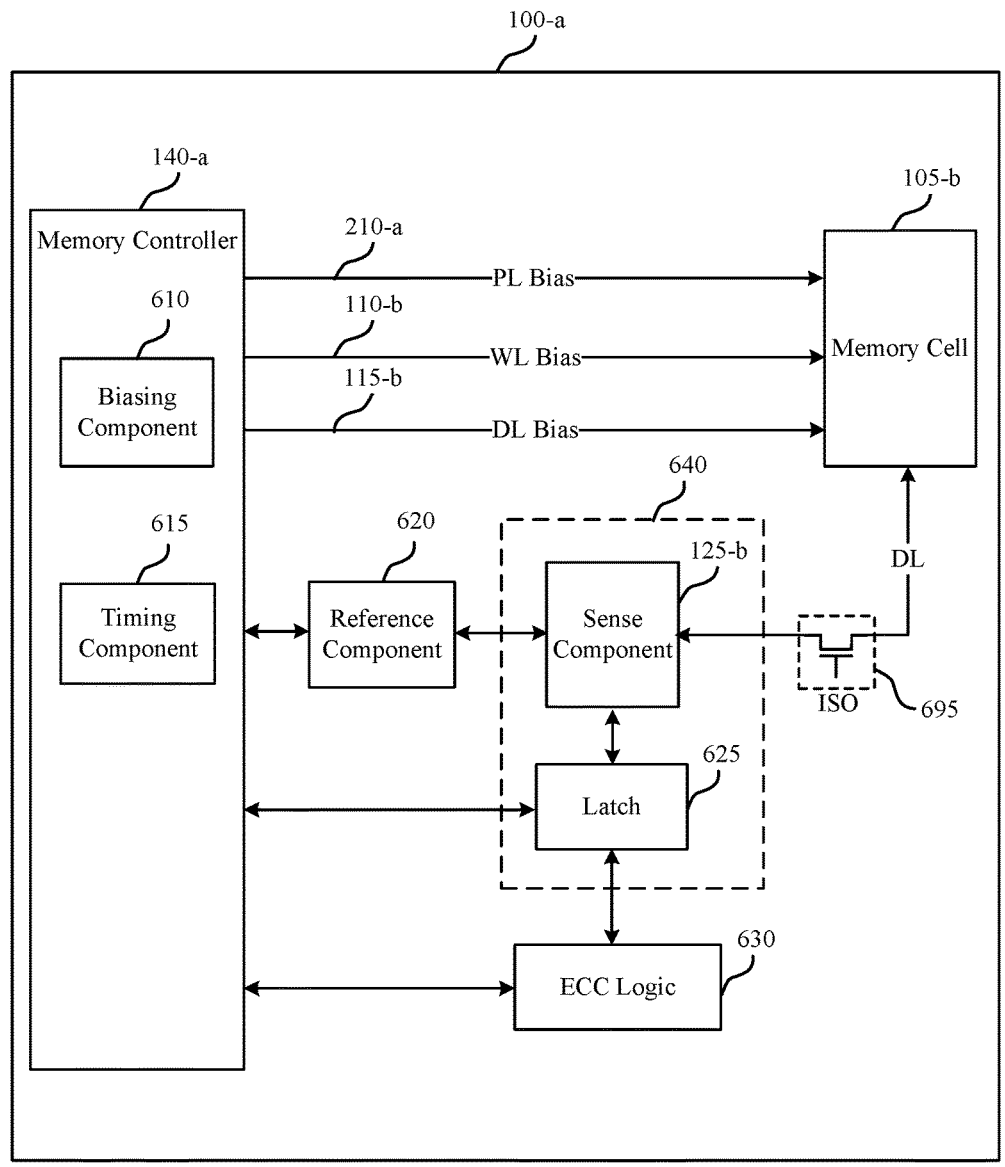
FIG. 6 shows a block diagram of a memory device that supports wear leveling for random access and ferroelectric memory in accordance with embodiments of the present disclosure.

FIG. 6 shows a block diagram 600 of a memory device 100-*a* that supports wear leveling for random access and ferroelectric memory in accordance with embodiments of the present disclosure. Memory device 100-*a* may be referred to as an electronic memory apparatus and include memory controller 140-*a* and memory cells 105-*b*, which may be examples of memory controller 140 and memory cell 105 described with reference to FIG. 1. Memory controller 140-*a* may be an internal logic circuit present on the same substrate with array of memory cells 105-*b*. The memory controller 140-*a* may also control operations associated with wear leveling and ECC function in conjunction with ECC logic during wear-leveling operations in accordance with embodiments of the present disclosure. Memory controller 140-*a* may include biasing component 610 and timing component 615 and may operate memory device 100-*a* as described with reference to FIG. 1. Memory controller 140-*a* may be in electronic communication with word line 110-*b*, digit line 115-*b*, plate line 210-*a*, and sense component 125-*b*, which may be examples of word line 110, digit line 115, plate line 210, and sense component 125 described with reference to FIGS. 1 and 2.

Memory device 100-*a* may also include reference component 620, latch 625, and ECC logic 630. Sense part 640 may include sense component 125-*b* and latch 625. Latch 625 may be an example of latch 127 described with reference to FIGS. 1 and 2. Also, memory device 100-*a* may include ISO device 695 which may be an example of ISO device 295 described with reference to FIG. 2. ISO device 695, during wear-leveling operation in accordance with embodiments of the present disclosure, may isolate the digit line nodes of sense component 125-*b* from digit line (DL) of memory cell 105-*b*. ISO device 695 enables a concurrent execution of step 3 and step 4 as explained above with reference to FIGS. 5A and 5B in accordance with embodiments of the present disclosure. The components of memory device 100-*a* may be in electronic communication with each other and may perform the functions described with reference to FIGS. 1 through 5. In some cases, reference component 620, sense component 125-*b*, and latch 625 may be components of memory controller 140-*a*.

Memory controller 140-*a* may be configured to activate word line 110-*b*, plate line 210-*a*, or digit line 115-*b* by applying voltages to those various nodes. For example, biasing component 610 may be configured to apply a voltage to operate memory cell 105-*b* to read, write, or pre-charge memory cell 105-*b* as described above. In some cases, memory controller 140-*a* may include a row decoder, column decoder, or both, as described with reference to FIG. 1. This may enable memory controller 140-*a* to access one or more memory cells 105. Biasing component 610 may also provide voltage potentials to reference component 620 in order to generate a reference signal for sense component 125-*b*. Additionally, biasing component 610 may provide voltage potentials for the operation of sense component 125-*b*.

In some cases, memory controller 140-*a* may perform its operations using timing component 615. For example, timing component 615 may control the timing of the various word line selections or plate line biasing, including timing for switching and voltage application to perform the memory functions, such as reading, writing, or pre-charging, discussed herein. In some cases, timing component 615 may control the operations of biasing component 610.

Reference component 620 may include various components to generate a reference signal for sense component 125-*b*. Reference component 620 may include circuitry configured to produce reference signals. In some cases, reference component 620 may include other ferroelectric memory cells 105. In some examples, reference component 620 may be configured to output a voltage with a value between the two sense voltages, as described with reference to FIG. 3. Or reference component 620 may be designed to output a virtual ground voltage (i.e., approximately 0V).

Sense component 125-*b* may compare a signal from memory cell 105-*b* (through digit line 115-*b*) with a reference signal from reference component 620. Upon determining the logic state, the sense component may then store the output in latch 625, where it may be used in accordance with the operations of an electronic device that memory device 100-*a* is a part.

In some cases, an electronic memory device may include a memory array comprising a plurality of sections of ferroelectric memory cells, each section of the plurality associated with a set of sense components and a set of latches, an error correction circuit in a periphery outside of the memory array, and a controller in electronic communication with the memory array, the set of sense components, the set of latches, and the error correction circuit, wherein the controller may be operable to cause a first set of latches to receive, a first set of data from a first section of the memory array, wherein the first set of latches is associated with the first section of the memory array, send the first set of data to a second set of latches through the error correction circuit, wherein the second set of latches is associated with a second section of the memory array, and send the first set of data to a second set of latches through the error correction circuit, wherein the second set of latches is associated with a second section of the memory array, and store the first set of data in the second section of the memory array.

In some cases, the controller may be operable to activate a row of memory cells of the first section, wherein the row of memory cells corresponds to the first set of data, sense the first set of data from the activated row of memory cells using a first set of sense components associated with the first section, and store the first set of data in the first set of latches. In some cases, the controller may be operable to deactivate the row of memory cells of the first section while holding the first set of data in the first set of latches. In some cases, the controller may be operable to isolate memory cells of the second section of the memory array based at least in part on deactivating isolation devices associated with the second section, and pre-write a row of the isolated memory cells of the second section to a first logic state.

In some cases, the controller may be operable to transfer the first set of data from the first set of latches to the error correction circuit, cause the error correction circuit to perform error correction operation on the first set of data, and transfer the first set of data from the error correction circuit to the second set of latches. In some cases, the controller may be operable to divide the first set of data into a plurality of subsets of data and send each subset of the plurality of subsets of data through the error correction circuit sequentially to the second set of latches.

In some cases, the controller may be operable to concurrently send the first set of data and pre-write the row of isolated memory cells of the second section. In some cases, the controller may be operable to close the first set of latches without pre-charging the row of the first section of the memory array. In some cases, the controller may be operable to pre-charge the pre-written row of the second section of the memory array with the first set of data in the second set of latches.

In some cases, an electronic memory device may include a memory array comprising a plurality of sections of ferroelectric memory cells, each section of the plurality associated with a set of sense components and a set of latches, an error correction circuit in a periphery outside of the memory array, and a controller in electronic communication with the memory array, the set of sense components, the set of latches, and the error correction circuit, wherein the controller may be operable to activate a row of memory cells corresponding to a first set of data, to receive the first set of data at a first set of latches, wherein the first set of latches is associated with a first section of the memory array, the first section comprising the row of memory cells, deactivate the row of memory cells of the first section while holding the first set of data in the first set of latches, pre-write a row of memory cells of a second section of the memory array with a first logic state after isolating memory cells of the second section based at least in part on deactivating isolation devices associated with the second section, send the first set of data to a second set of latches through the error correction circuit, wherein the second set of latches is associated with the second section, close the first set of latches without pre-charging the row of memory cells of the first section, and pre-charge the pre-written row of memory cells of the second section with the first set of data in the second set of latches.

Figure 7:
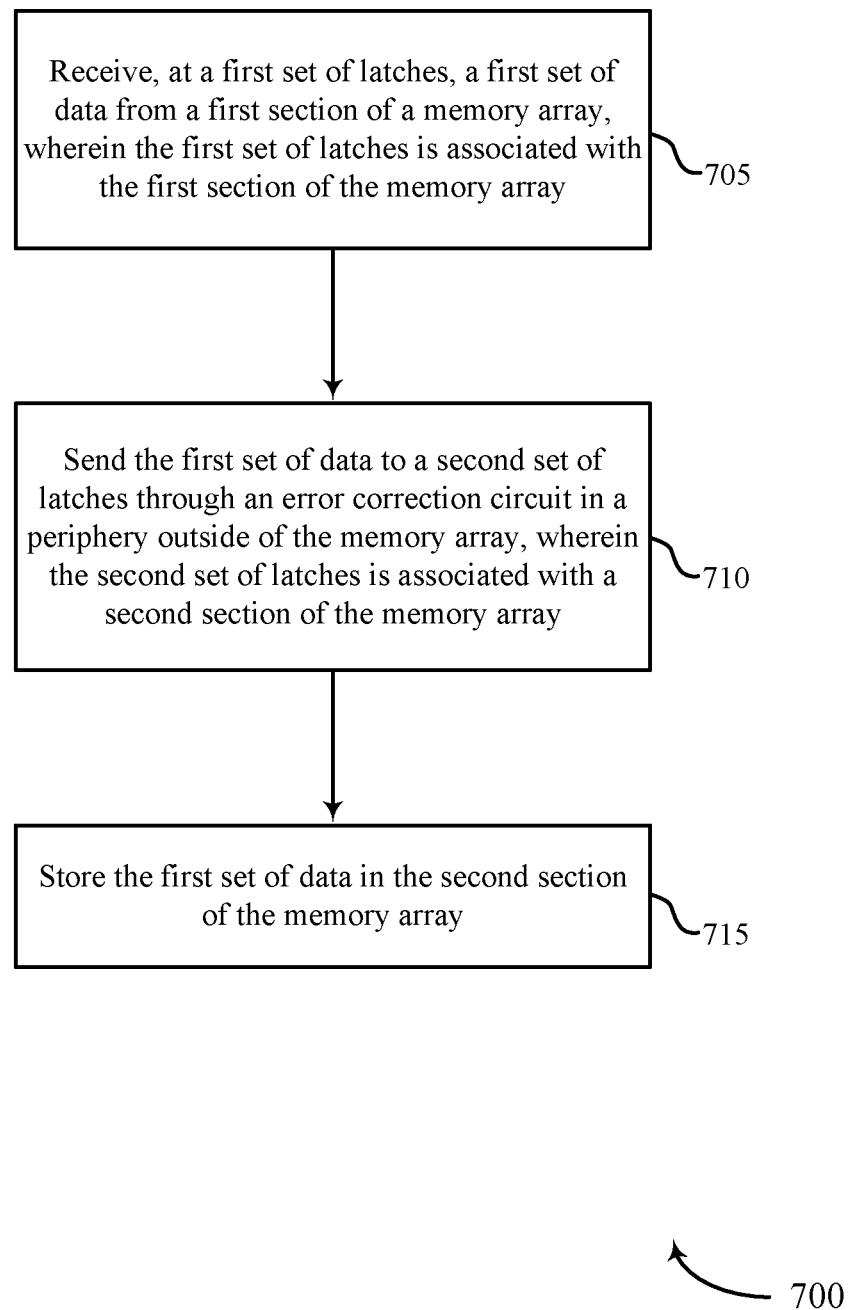
FIG. 7 shows a flowchart illustrating a method for wear leveling for random access and ferroelectric memory in accordance with embodiments of the present disclosure.

FIG. 7 shows a flowchart illustrating a method 700 for wear leveling for random access and ferroelectric memory in accordance with embodiments of the present disclosure. The operations of method 700 may be implemented by a memory controller 140 or its components as described herein. In some examples, a memory controller 140 may execute a set of codes to control the functional elements of the device to perform the functions described below. Additionally or alternatively, the memory controller 140 may perform some or all of the functions described below using special-purpose hardware.

At block 705 the memory controller 140 may receive, at a first set of latches, a first set of data from a first section of a memory array, wherein the first set of latches is associated with the first section of the memory array. The operations of block 705 may be performed according to the methods described with reference to FIGS. 1 through 6.

At block 710 the memory controller 140 may send the first set of data to a second set of latches through an error correction circuit in a periphery outside of the memory array, wherein the second set of latches is associated with a second section of the memory array. The operations of block 710 may be performed according to the methods described with reference to FIGS. 1 through 6.

At block 715 the memory controller 140 may store the first set of data in the second section of the memory array. The operations of block 715 may be performed according to the methods described with reference to FIGS. 1 through 6.

In some embodiments, a method for wear leveling for random access and ferroelectric memory is disclosed. The method may include receiving, at a first set of latches, a first set of data from a first section of a memory array, wherein the first set of latches is associated with the first section of the memory array, sending the first set of data to a second set of latches through an error correction circuit in a periphery outside of the memory array, wherein the second set of latches is associated with a second section of the memory array, and storing the first set of data in the second section of the memory array.

In some cases, the receiving may include activating a row of memory cells of the first section, wherein the row of memory cells corresponds to the first set of data, sensing the first set of data from the activated row of memory cells using a first set of sense components associated with the first section, and storing the first set of data in the first set of latches. In some cases, the method may further include deactivating the row of memory cells of the first section while holding the first set of data in the first set of latches.

In some cases, the method further include isolating memory cells of the second section of the memory array based at least in part on deactivating isolation devices associated with the second section and pre-writing a row of the isolated memory cells of the second section to a first logic state. In some cases, the first logic state corresponds to a logic state of one (1). In some cases, the sending may include transferring the first set of data from the first set of latches to the error correction circuit, causing the error correction circuit to perform error correction operation on the first set of data, and transferring the first set of data from the error correction circuit to the second set of latches.

In some cases, the method may further include dividing the first set of data into a plurality of subsets of data and sending each subset of the plurality of subsets of data through the error correction circuit sequentially to the second set of latches. In some cases, the sending the first set of data and the pre-writing the row of isolated memory cells of the second section may occur concurrently. In some cases, the method may further include closing the first set of latches without pre-charging the row of the first section of the memory array. In some cases, the method may further include pre-charging the pre-written row of the second section of the memory array with the first set of data in the second set of latches. In some cases, the pre-charging the pre-written row of the second section may include writing a second logic state when the first set of data is different than the pre-written first logic state. In some cases, the second logic state may correspond to a logic state of zero (0).

Figure 8:
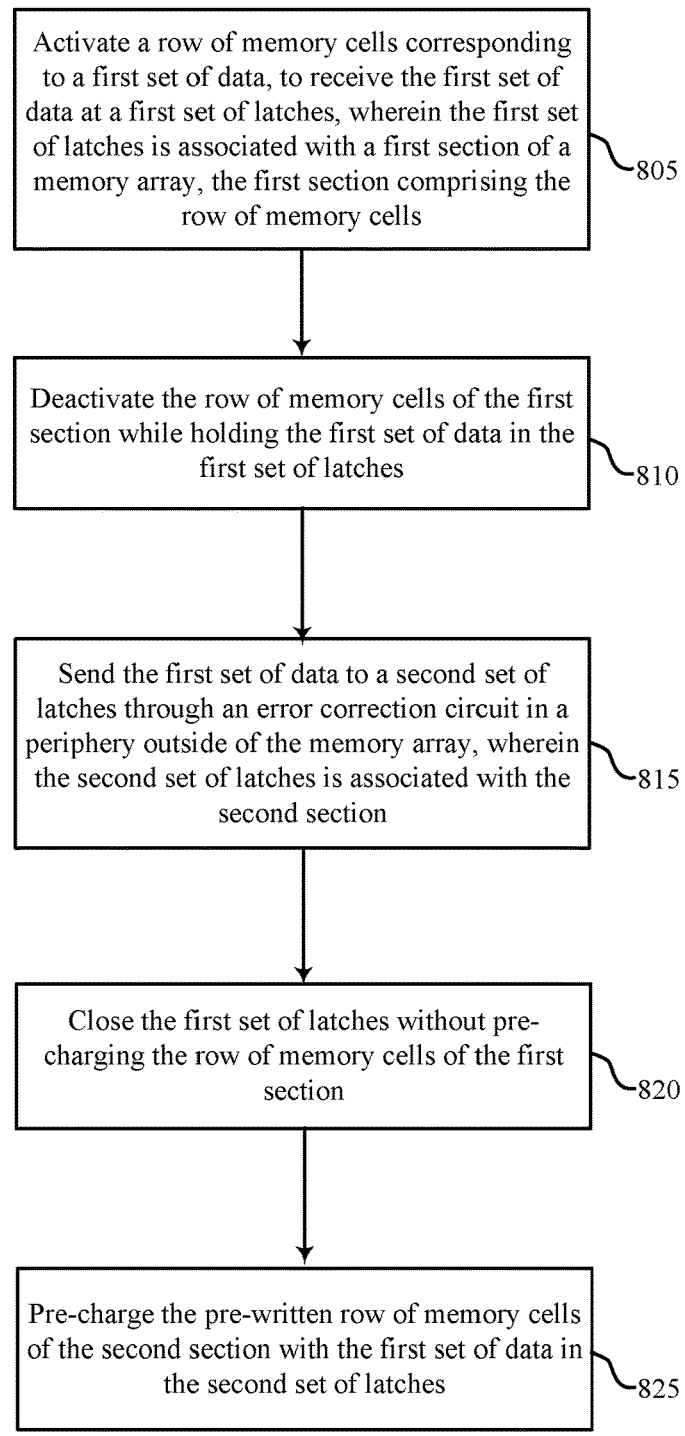
FIG. 8 shows a flowchart illustrating a method for wear leveling for random access and ferroelectric memory in accordance with embodiments of the present disclosure

FIG. 8 shows a flowchart illustrating a method 800 for wear leveling for random access and ferroelectric memory in accordance with embodiments of the present disclosure. The operations of method 800 may be implemented by a memory controller 140 or its components as described herein. In some examples, a memory controller 140 may execute a set of codes to control the functional elements of the device to perform the functions described below. Additionally or alternatively, the memory controller 140 may perform some or all of the functions described below using special-purpose hardware.

At block 805 the memory controller 140 may activate a row of memory cells corresponding to a first set of data, to receive the first set of data at a first set of latches, wherein the first set of latches is associated with a first section of a memory array, the first section comprising the row of memory cells. The operations of block 805 may be performed according to the methods described with reference to FIGS. 1 through 6.

At block 810 the memory controller 140 may deactivate the row of memory cells of the first section while holding the first set of data in the first set of latches. The operations of block 810 may be performed according to the methods described with reference to FIGS. 1 through 6.

At block 815 the memory controller 140 may send the first set of data to a second set of latches through an error correction circuit in a periphery outside of the memory array, wherein the second set of latches is associated with the second section. The operations of block 815 may be performed according to the methods described with reference to FIGS. 1 through 6.

At block 820 the memory controller 140 may close the first set of latches without pre-charging the row of memory cells of the first section. The operations of block 820 may be performed according to the methods described with reference to FIGS. 1 through 6.

At block 825 the memory controller 140 may pre-charge the pre-written row of memory cells of the second section with the first set of data in the second set of latches. The operations of block 825 may be performed according to the methods described with reference to FIGS. 1 through 6.

In some embodiments, a method for wear leveling for random access and ferroelectric memory is disclosed. The method may include activating a row of memory cells corresponding to a first set of data, to receive the first set of data at a first set of latches, wherein the first set of latches is associated with a first section of a memory array, the first section comprising the row of memory cells, deactivating the row of memory cells of the first section while holding the first set of data in the first set of latches, pre-writing a row of memory cells of a second section of the memory array with a first logic state after isolating memory cells of the second section based at least in part on deactivating isolation devices associated with the second section, sending the first set of data to a second set of latches through an error correction circuit in a periphery outside of the memory array, wherein the second set of latches is associated with the second section, closing the first set of latches without pre-charging the row of memory cells of the first section, and pre-charging the pre-written row of memory cells of the second section with the first set of data in the second set of latches.

In some cases, the activating may include sensing the first set of data from the activated row of memory cells using a first set of sense components associated with the first section and storing the first set of data in the first set of latches. In some cases, the sending may include dividing the first set of data into a plurality of subsets of data, transferring each subset of the plurality sequentially to the error correction circuit, causing the error correction circuit to perform error correction operation on each subset of the plurality, and transferring each subset of the plurality from the error correction circuit to the second set of latches.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it may be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including memory device 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" may not be construed as a reference to a closed set of conditions. For example, an exemplary step that is described as "based on condition A" may be based on both a condition A and a condition B without departing from the scope of the present disclosure. In other words, as used herein, the phrase "based on" may be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure may be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
receiving, at a first set of latches, a first set of data from a first section of a memory array, wherein the first set of latches is associated with the first section of the memory array;
sending the first set of data to a second set of latches through an error correction circuit in a periphery outside of the memory array, wherein the second set of latches is associated with a second section of the memory array; and
storing the first set of data in the second section of the memory array.

2. The method of claim 1, wherein the receiving comprises:
activating a row of memory cells of the first section, wherein the row of memory cells corresponds to the first set of data;
sensing the first set of data from the activated row of memory cells using a first set of sense components associated with the first section; and
storing the first set of data in the first set of latches.

3. The method of claim 2, further comprising:
deactivating the row of memory cells of the first section while holding the first set of data in the first set of latches.

4. The method of claim 3, further comprising:
isolating memory cells of the second section of the memory array based at least in part on deactivating isolation devices associated with the second section; and
pre-writing a row of the isolated memory cells of the second section to a first logic state.

5. The method of claim 4, wherein the first logic state corresponds to a logic state of one (1).

6. The method of claim 4, wherein the sending comprises:
transferring the first set of data from the first set of latches to the error correction circuit;
causing the error correction circuit to perform error correction operation on the first set of data; and
transferring the first set of data from the error correction circuit to the second set of latches.

7. The method of claim 6, further comprising:
dividing the first set of data into a plurality of subsets of data; and
sending each subset of the plurality of subsets of data through the error correction circuit sequentially to the second set of latches.

8. The method of claim 6, wherein:
the sending the first set of data and the pre-writing the row of isolated memory cells of the second section occur concurrently.

9. The method of claim 6, further comprising:
closing the first set of latches without pre-charging the row of the first section of the memory array.

10. The method of claim 9, further comprising:
pre-charging the pre-written row of the second section of the memory array with the first set of data in the second set of latches.

11. The method of claim 10, wherein the pre-charging the pre-written row of the second section comprises:
writing a second logic state when the first set of data is different than the pre-written first logic state.

12. The method of claim 11, wherein the second logic state corresponds to a logic state of zero (0).

13. An electronic memory device, comprising:
a memory array comprising a plurality of sections of ferroelectric memory cells, each section of the plurality associated with a set of sense components and a set of latches;
an error correction circuit in a periphery outside of the memory array; and
a controller in electronic communication with the memory array, the set of sense components, the set of latches, and the error correction circuit, wherein the controller is operable to:
cause a first set of latches to receive, a first set of data from a first section of the memory array, wherein the first set of latches is associated with the first section of the memory array;
send the first set of data to a second set of latches through the error correction circuit, wherein the second set of latches is associated with a second section of the memory array; and
store the first set of data in the second section of the memory array.

14. The electronic memory device of claim 13, wherein the controller is operable to:

activate a row of memory cells of the first section, wherein the row of memory cells corresponds to the first set of data;

sense the first set of data from the activated row of memory cells using a first set of sense components associated with the first section; and store the first set of data in the first set of latches.

15. The electronic memory device of claim 14, wherein the controller is operable to:

deactivate the row of memory cells of the first section while holding the first set of data in the first set of latches.

16. The electronic memory device of claim 15, wherein the controller is operable to:

isolate memory cells of the second section of the memory array based at least in part on deactivating isolation devices associated with the second section; and pre-write a row of the isolated memory cells of the second section to a first logic state.

17. The electronic memory device of claim 16, wherein the controller is operable to:

transfer the first set of data from the first set of latches to the error correction circuit;

cause the error correction circuit to perform error correction operation on the first set of data; and transfer the first set of data from the error correction circuit to the second set of latches.

18. The electronic memory device of claim 17, wherein the controller is operable to:

divide the first set of data into a plurality of subsets of data; and send each subset of the plurality of subsets of data through the error correction circuit sequentially to the second set of latches.

19. The electronic memory device of claim 17, wherein the controller is operable to:

concurrently send the first set of data and pre-write the row of isolated memory cells of the second section.

20. The electronic memory device of claim 17, wherein the controller is operable to:

close the first set of latches without pre-charging the row of the first section of the memory array.

21. The electronic memory device of claim 20, wherein the controller is operable to:

pre-charge the pre-written row of the second section of the memory array with the first set of data in the second set of latches.

22. A method, comprising:

activating a row of memory cells corresponding to a first set of data, to receive the first set of data at a first set of latches, wherein the first set of latches is associated with a first section of a memory array, the first section comprising the row of memory cells;

deactivating the row of memory cells of the first section while holding the first set of data in the first set of latches;

pre-writing a row of memory cells of a second section of the memory array with a first logic state after isolating memory cells of the second section based at least in part on deactivating isolation devices associated with the second section;

sending the first set of data to a second set of latches through an error correction circuit in a periphery outside of the memory array, wherein the second set of latches is associated with the second section;

closing the first set of latches without pre-charging the row of memory cells of the first section; and pre-charging the pre-written row of memory cells of the second section with the first set of data in the second set of latches.

23. The method of claim 22, wherein the activating comprises:

sensing the first set of data from the activated row of memory cells using a first set of sense components associated with the first section; and storing the first set of data in the first set of latches.

24. The method of claim 22, wherein the sending comprises:

dividing the first set of data into a plurality of subsets of data;

transferring each subset of the plurality sequentially to the error correction circuit;

causing the error correction circuit to perform error correction operation on each subset of the plurality; and transferring each subset of the plurality from the error correction circuit to the second set of latches.

25. An electronic memory device, comprising:

a memory array comprising a plurality of sections of ferroelectric memory cells, each section of the plurality associated with a set of sense components and a set of latches;

an error correction circuit in a periphery outside of the memory array; and a controller in electronic communication with the memory array, the set of sense components, the set of latches, and the error correction circuit, wherein the controller is operable to:

activate a row of memory cells corresponding to a first set of data, to receive the first set of data at a first set of latches, wherein the first set of latches is associated with a first section of the memory array, the first section comprising the row of memory cells;

deactivate the row of memory cells of the first section while holding the first set of data in the first set of latches;

pre-write a row of memory cells of a second section of the memory array with a first logic state after isolating memory cells of the second section based at least in part on deactivating isolation devices associated with the second section;

send the first set of data to a second set of latches through the error correction circuit, wherein the second set of latches is associated with the second section;

close the first set of latches without pre-charging the row of memory cells of the first section; and pre-charge the pre-written row of memory cells of the second section with the first set of data in the second set of latches.

* * * * *